US007728404B2

(12) United States Patent
Van Dalen et al.

(10) Patent No.: US 7,728,404 B2
(45) Date of Patent: *Jun. 1, 2010

(54) PUNCHTHROUGH DIODE AND METHOD OF MANUFACTURING THEREOF

(75) Inventors: Rob Van Dalen, Eindhoven (NL); Gerrit Elbert Johannes Koops, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/239,267

(22) Filed: Sep. 26, 2008

(65) Prior Publication Data

US 2009/0026500 A1    Jan. 29, 2009

Related U.S. Application Data

(63) Continuation of application No. 10/545,622, filed as application No. PCT/IB2004/050102 on Feb. 12, 2004, now Pat. No. 7,482,669.

(30) Foreign Application Priority Data

Feb. 18, 2003  (EP)  .................................. 03100367

(51) Int. Cl.
    *H01L 29/861*  (2006.01)
(52) U.S. Cl. .............................. 257/497; 257/E29.332; 438/546
(58) Field of Classification Search ................. 257/173, 257/181, 276, 355, 361, 362, 618, 621, 497, 257/498, E29.332; 438/546, 570
See application file for complete search history.

(56) References Cited

U.S. PATENT DOCUMENTS

| | | | | |
|---|---|---|---|---|
| 4,003,072 A | * | 1/1977 | Matsushita et al. | 257/170 |
| 4,223,328 A | * | 9/1980 | Terasawa et al. | 257/136 |
| 4,275,408 A | * | 6/1981 | Yukimoto | 257/136 |
| 4,356,503 A | * | 10/1982 | Shafer et al. | 257/165 |
| 4,405,932 A | * | 9/1983 | Ishii et al. | 257/497 |
| 4,484,214 A | * | 11/1984 | Misawa et al. | 257/147 |
| 4,654,688 A | * | 3/1987 | Fukushima | 257/517 |
| 4,782,379 A | * | 11/1988 | Baliga | 257/142 |
| 4,821,095 A | * | 4/1989 | Temple | 257/145 |
| 4,866,500 A | * | 9/1989 | Nishizawa et al. | 257/114 |
| 4,967,256 A | * | 10/1990 | Pathak et al. | 257/112 |
| 5,001,537 A | * | 3/1991 | Colman et al. | 257/173 |
| 5,028,974 A | * | 7/1991 | Kitagawa et al. | 257/149 |
| 5,162,876 A | * | 11/1992 | Kitagawa et al. | 257/138 |
| 5,399,899 A | * | 3/1995 | Dekker et al. | 257/566 |

(Continued)

*Primary Examiner*—Thao X Le
*Assistant Examiner*—William F Kraig

(57) ABSTRACT

A semiconductor device includes a substrate of a first conductivity type, and a first semiconductor region that includes a plurality of sub-regions of the first conductivity type that have a first doping concentration and a further semiconductor region of a second conductivity type opposite to the first conductivity type. The further semiconductor region separates the sub-regions from each other and the first semiconductor region is located on the substrate. The semiconductor device further includes a second semiconductor region of the first conductivity type located on the first semiconductor region, a third semiconductor region of the second conductivity type located on the second semiconductor region, and a fourth semiconductor region of the first conductivity type located on the third semiconductor region. The sub regions extend from the second semiconductor region into the substrate, and the thickness and the doping concentration of the second and the third semiconductor region are such that these regions are completely depleted during operation of the device.

16 Claims, 5 Drawing Sheets

U.S. PATENT DOCUMENTS

Figure 1:
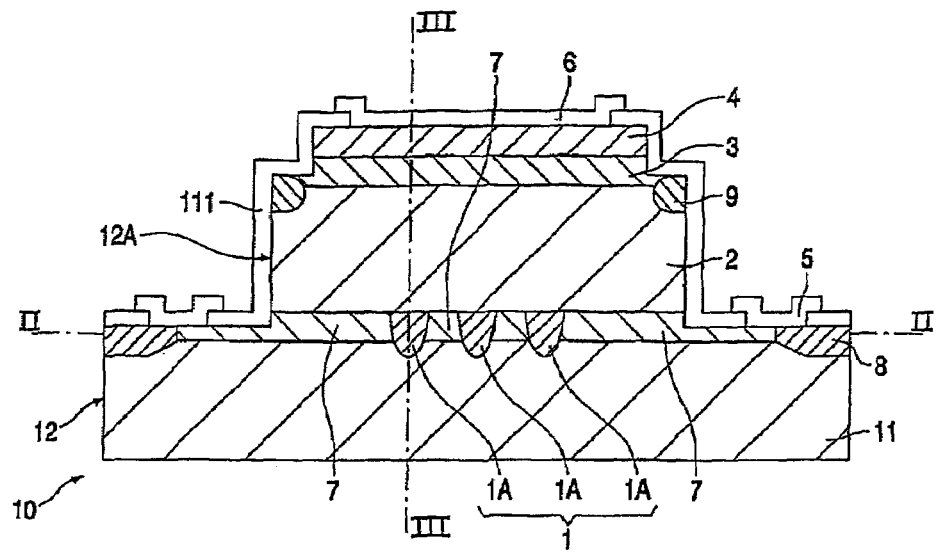

| | | | | |
|---|---|---|---|---|
| 5,479,031 A | * | 12/1995 | Webb et al. | 257/173 |
| 5,519,245 A | * | 5/1996 | Tokura et al. | 257/376 |
| 5,569,941 A | * | 10/1996 | Takahashi | 257/133 |
| 5,969,400 A | * | 10/1999 | Shinohe et al. | 257/492 |
| 6,066,878 A | * | 5/2000 | Neilson | 257/342 |
| 6,448,589 B1 | * | 9/2002 | Casey et al. | 257/173 |
| 6,459,133 B1 | * | 10/2002 | Brown et al. | 257/497 |
| 6,597,052 B2 | * | 7/2003 | Hurkx et al. | 257/497 |
| 6,677,643 B2 | * | 1/2004 | Iwamoto et al. | 257/341 |
| 7,482,669 B2 | * | 1/2009 | Van Dalen et al. | 257/497 |

* cited by examiner

PUNCHTHROUGH DIODE AND METHOD OF MANUFACTURING THEREOF

RELATED PATENT DOCUMENTS

This patent document is a continuation under 35 U.S.C. §120 of U.S. patent application Ser. No. 10/545,622 filed on Aug. 16, 2005, now U.S. Pat. No. 7,482,669 which is a 35 U.S.C. §371 national stage entry of International Application No. PCT/IB2004/050102 filed on Feb. 12, 2004, which claims priority benefit under 35 U.S.C. §119 of European Patent Application No. 03100367.6 filed on Feb. 18, 2003, to which priority is also claimed here.

The invention relates to a semiconductor device with a substrate and a semiconductor body comprising, in succession, a first semiconductor region of a first conductivity type and having a first doping concentration, a second semiconductor region having a second doping concentration which is lower than the first doping concentration, a third semiconductor region of a second conductivity type, opposite to the first conductivity type, and having a third doping concentration ranging between the first and the second doping concentration, and a fourth semiconductor region of the first conductivity type and having a fourth doping concentration which is higher than the third doping concentration, wherein the first and the fourth semiconductor region are each provided with an electric connection conductor, one of which is situated on the side of the substrate and the other of which is situated on the surface of the semiconductor body and across which an electric voltage is applied during operation of the device, wherein the thickness and the doping concentration of the second and the third semiconductor region are chosen such that these regions are completely depleted during operation. Such a device, also referred to as punchthrough diode, is an attractive alternative to Zener diodes, in particular at an operating voltage below approximately 5 volts, as a suppressor of peak voltages owing to its steep punchthrough characteristic and low capacitance.

The invention also relates to a method of manufacturing such a device.

Such a device is known from United States patent specification U.S. Pat. No. 4,405,932, published on 20 Sep. 1983. In said document a description is given of a diode with a n+ substrate that comprises the first semiconductor region, on which a stack of the second, third and fourth semiconductor region is situated, being an n− region, a p region and an n+ region, respectively. The substrate and the n+ region are provided with connection conductors. The n− region comprises an epitaxial layer wherein the p− region is formed as a recessed region; in said p− region in turn the n+ region is formed as a recessed region.

Experiments have shown that a drawback of the known device resides in that the I-V (=Current-Voltage) characteristic of the diode does not exhibit the desired variation, i.e. the transition is not straight and steep, in particular if the diode is designed such that the so-termed punchthrough voltage is above 2 volts. Also the behavior of the diode is not stable.

Therefore it is an object of the present invention to provide a device of the type mentioned in the opening paragraph in which said drawback is (at least partly) obviated and which has a very straight and steep I-V characteristic, further wherein if the punchthrough voltage is above 2 volts, and which is very stable.

To achieve this, in accordance with the invention, a device of the type mentioned in the opening paragraph is characterized in that a part of the first semiconductor region bordering on the second semiconductor region comprises a number of sub-regions which are separated from each other by a further semiconductor region of the second conductivity type which is electrically connected to the first connection conductor. It has been found that such a device has a very steep I-V characteristic also at a design voltage above 2 volts. The invention is based, inter alia, on the following recognition. A punchthrough diode can be regarded as a bipolar transistor with an open base, i.e. without a base connection. If a forward voltage is applied to the device, the junction between the (lightly doped) p− region and the n++ region, or in the event of a lightly doped n− region instead of a lightly doped p− region, the junction between the p+ and the n− region, is slightly forward-poled. This means that the n++ region then serves as the emitter of the transistor, the p+ region as the base and the p− region as a part of the base, and the n++ substrate forms the collector. If the collector-emitter breakdown voltage of the transistor (=BVCEO) is lower than the punchthrough voltage at any current strength, the diode will exhibit a negative resistance behavior. This may cause instability, such as undesirable oscillation. A relation between the BVCEO and the junction breakdown voltage (=BVCBO) is: BVCEO=BVCBO/$\beta^{1/n}$, where $\beta$ is the current gain that is equal to the quotient of the base current (ib) and the collector current (ic) and n has a value in the range between 3 and 4. The base current is determined by the recombination of holes and electrons in the lightly doped region, i.e. the p− region or the n− region. In the known diode, the current gain may be very high, which is attributable in particular to the fact that the base region is substantially or partly depleted, and in addition to the fact that the recombination in said regions is very low due to the long recombination lifetime of charge carriers in (bulk) silicon. In addition, the lateral diffusion-capability of holes is limited because the base region is depleted during operation. As a result, BVCEO is low. In a device in accordance with the invention, on the one hand, the further semiconductor region, which is of the p conductivity type in the example discussed, provides an escape route for the holes generated by impact ionization. As this region is, as it were, distributed over the first semiconductor region, this escape route is present everywhere and the holes need not bridge a distance, at least in the lateral direction, to reach the escape route and can readily flow from the base to the emitter. As the holes can be readily drained, the base current is increased and hence the gain reduced. The occurrence of collector-emitter breakdown is thus precluded and hence also the occurrence of instability (oscillation) caused by negative resistance behavior. On the other hand, the first, n-type, semiconductor region that is divided into parts still provides excellent contact for the main constituent of the electric current through the device, i.e. the electron current. As a result, the I-V characteristic is very steep, which is highly desirable.

The, for example p+, parts of the further semiconductor region may extend up to the (p-type) base region. However, this is not necessary. An advantage of a separation between these parts and the base region by means of the lightly doped n− layer, which is sufficiently highly doped not to be depleted already at 0 volt, resides in that the capacitance of the punchthrough diode in accordance with the invention can be minimized.

In a first particularly advantageous embodiment, the substrate comprises a semiconductor substrate of the first conductivity type that borders on the first semiconductor region, and the semiconductor body comprises another semiconductor region of the first conductivity type having a higher doping concentration than the substrate, which other semiconductor region is connected to the substrate and, by means of the first electric conductor, to the further semiconductor region. In this modification the, p-type, base region is situated close to the surface of the semiconductor body. This has the advantage that this region can be readily formed by means of a very well defined ion implantation. As a result, the punchthrough voltage, that depends directly on the doping concentration of the base region, can be readily and accurately determined. An important additional advantage of this modification resides in that different voltage regulators/ESD (=Electro Static Discharge) protection devices are integrated in the same semiconductor body. The further semiconductor region, which is buried in this modification, can be brought to the voltage level of the collector region by means of a separate connection region. Preferably, however, like in this modification, the further semiconductor region is short-circuited with the substrate via a conductor (metal).

In a different modification the substrate comprises a semiconductor substrate of the first conductivity type and the fourth semiconductor region, and the further semiconductor region borders directly on the first conductor. This modification, wherein the emitter region of the punchthrough diode borders on the surface of the semiconductor body, has the advantage that the manufacture of the device is comparatively simple because the semiconductor layer structure can be formed in a single (epitaxial) growth process. In addition, the manufacture is very compatible with that of present-day bipolar transistors, such as those manufactured in BiCMOS (Bipolar Complementary Metal Oxide Semiconductor) technology. An additional advantage of this modification resides in that the n+ region separating the base region from a connection conductor can readily be made so as to be very thin. The hole current can thus readily recombine at the interface between the semiconductor material, such as silicon, and the metal of the conduction conductor. As a result, the current gain is slightly further reduced.

In both said modifications, preferably, a part of the further semiconductor region that borders on a sub-region of the first semiconductor region has a larger width than the other parts of the further semiconductor region. By virtue thereof, the so-termed clamping characteristic of a device in accordance with the invention can be readily controlled in the reverse direction. In such a case, the electron current flows substantially uniformly through the base region since this has a uniform potential. As a result, a small voltage drop will occur under the wide part of the p+ region because the electron current must pass through the comparatively wide, lightly doped n− region. At a certain current intensity, this voltage drop is such that it causes the p+/n junction to become forward-poled, and the associated hole current will now drive the intrinsic npn transistor. As a result, a sudden decrease of the clamping voltage occurs. The wide(r) part of the further semiconductor region may be positioned everywhere/anywhere, but is preferably located at the edge of the device. This has the advantage that the influence of any alignment errors in the manufacturing process, which normally manifest themselves at the edge, is comparatively small. A suitable width of the wider part ranges between 5 and 20 µm, and the other parts of the further semiconductor region preferably have a width in the range of 1 to 5 µm. The latter width is preferably also used for the width of the sub-regions of the first semiconductor region. As already indicated hereabove, the first conductivity type preferably is the n-conductivity type. This has the advantage that maximum advantage can be made of the greater mobility of electrons as compared to holes.

A method of manufacturing a semiconductor device, wherein a semiconductor body with a substrate is formed, wherein there is formed in the semiconductor body, in this order, a first semiconductor region of a first conductivity type and having a first doping concentration, a second semiconductor region having a second doping concentration that is lower than the first doping concentration, a third semiconductor region of a second conductivity type, which is opposite to the first conductivity type, and having a third doping concentration ranging between the first and the second doping concentration, and a fourth semiconductor region of the first conductivity type and having a fourth doping concentration that is higher than the third doping concentration, wherein the first and the fourth semiconductor region are provided with an electric connection conductor across which an electric voltage is applied during operation of the device, and wherein the thickness and the doping concentration of the second semiconductor region are chosen such that, during operation, the second semiconductor region is completely depleted, is characterized in accordance with the invention in that a part of the first semiconductor region that borders on the second semiconductor region is divided into a number of sub-regions which are separated from each other by a further semiconductor region of the second conductivity type which is connected to the first connection conductor. In this manner a device in accordance with the invention is obtained.

In a favorable modification thereof, a semiconductor substrate of the first conductivity type is chosen as the substrate, and the first semiconductor region is formed thereby. In the semiconductor body another semiconductor region of the first conductivity type is formed having a higher doping concentration than the substrate, which other semiconductor region is connected to the substrate and, by means of the first electric conductor, to the further semiconductor region. A device in accordance with the invention having the above-discussed advantages is thus obtained.

In another modification, on the substrate a lightly doped epitaxial semiconductor layer is applied, which is provided with the second conductivity type by means of an ion implantation that reaches at least as far as the substrate, and wherein the sub-regions of the first semiconductor region and the other semiconductor region are formed by means of a further ion implantation that reaches at least as far as the substrate, after which the second, third and fourth semiconductor region are formed by means of epitaxy, a part of the second, third and fourth semiconductor region situated above the other semiconductor region are removed, and the electric conductors are provided.

This method is comparatively simple and compatible with the customary processes in the silicon technology.

In a further modification, a semiconductor substrate of the first conductivity type is chosen as the substrate and, as a result, the fourth semiconductor region is formed and the further semiconductor region which borders directly on the first conductor is formed.

Preferably, the third, second and first semiconductor region are successively provided on the substrate by means of epitaxy, whereafter the further semiconductor region is formed in the first semiconductor region by means of ion implantation, after which the electric conductors are provided. This method comprises comparatively few steps and is consequently attractive.

In all modifications, preferably one of the parts of the further semiconductor region which border on a sub-region of the first semiconductor region is provided with a larger width than the other parts. By virtue thereof, the properties of a device in accordance with the invention can be controlled in the reverse direction.

These and other aspects of the invention are apparent from and will be elucidated with reference to the embodiment(s) described hereinafter.

Figure 2:
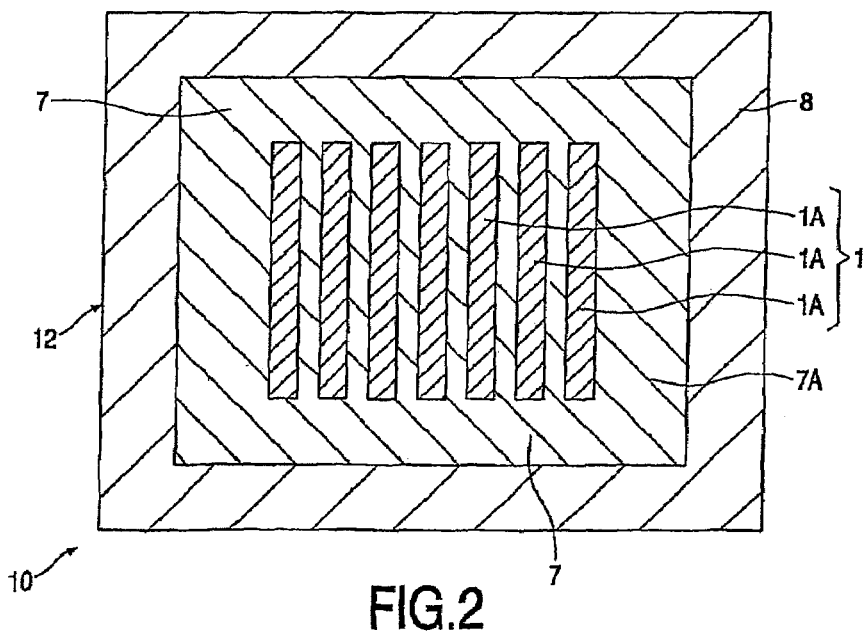
Figure 3:
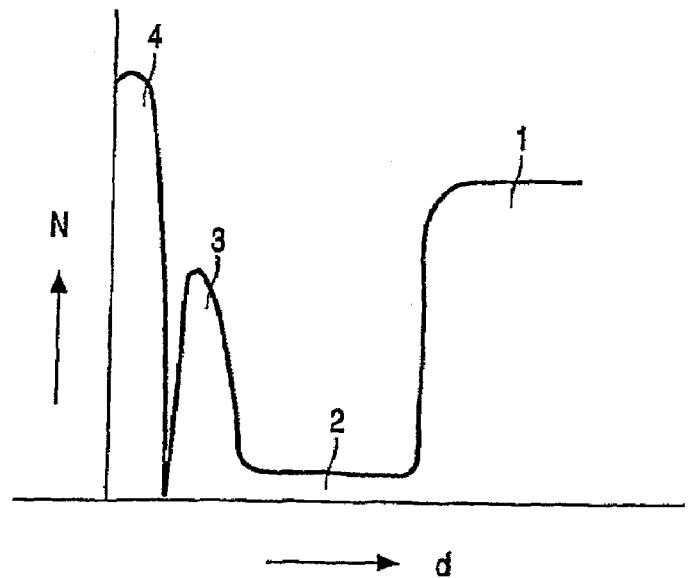
Figure 4:
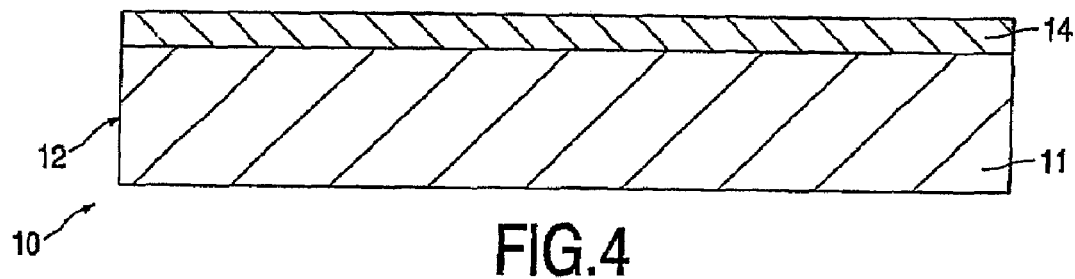
Figure 5:
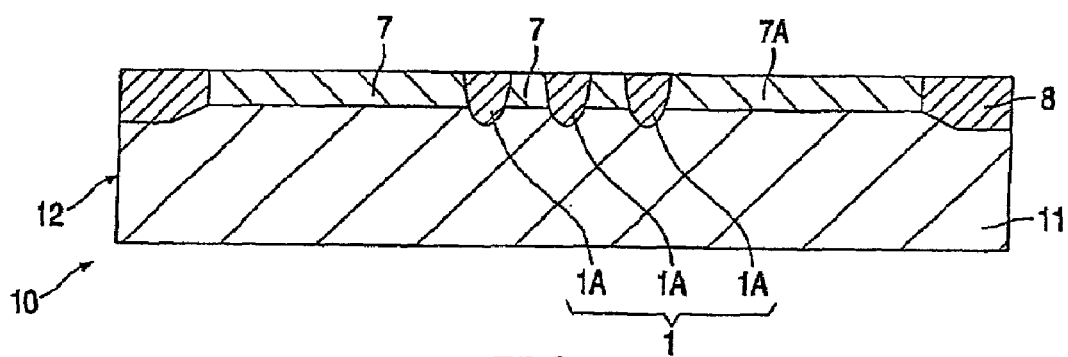
Figure 6:
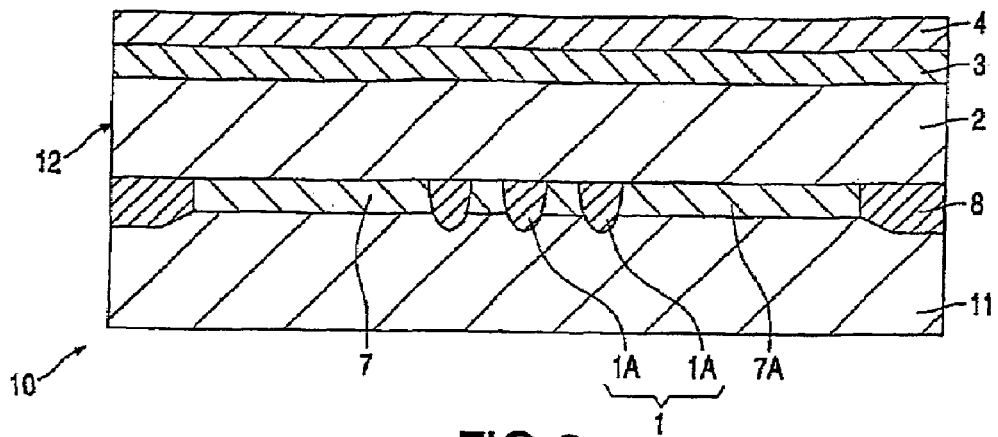
Figure 7:
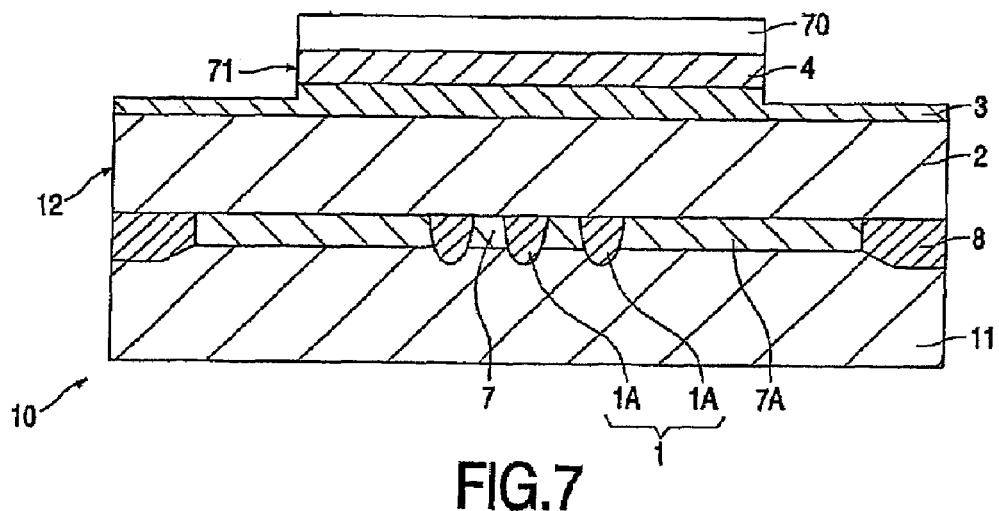
Figure 8:
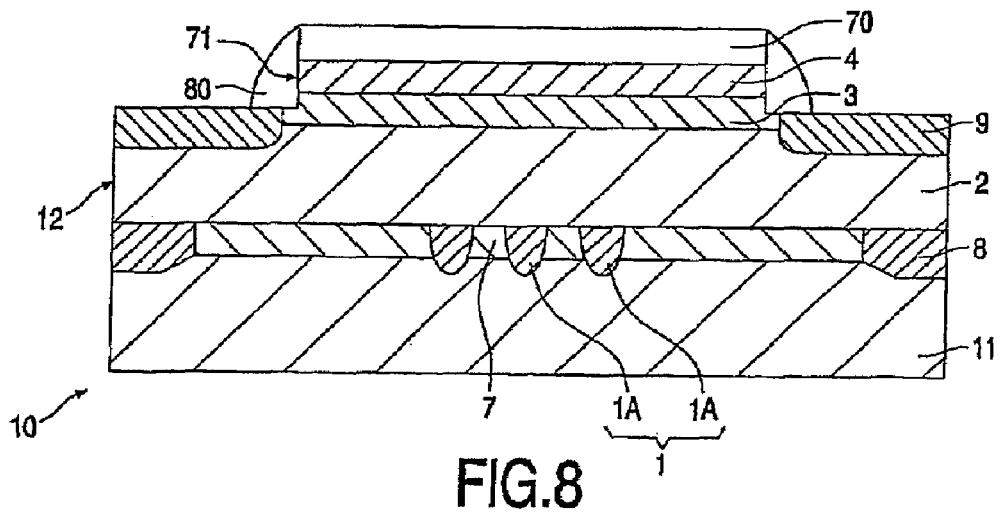
Figure 9:
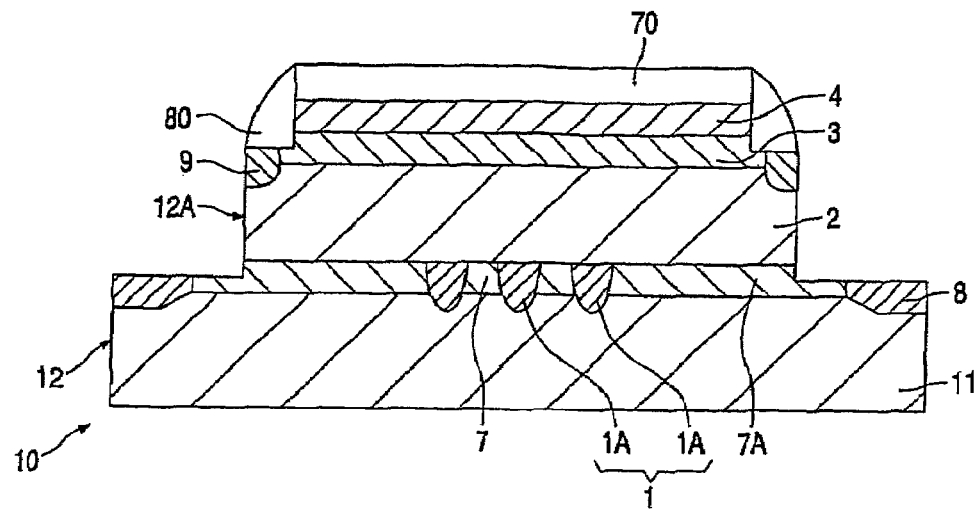
Figure 10:
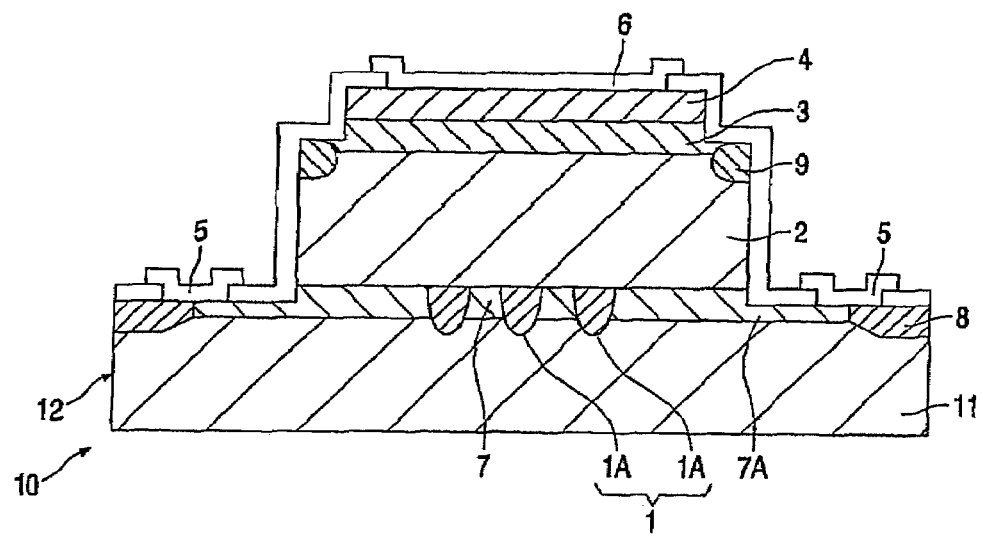
Figure 11:
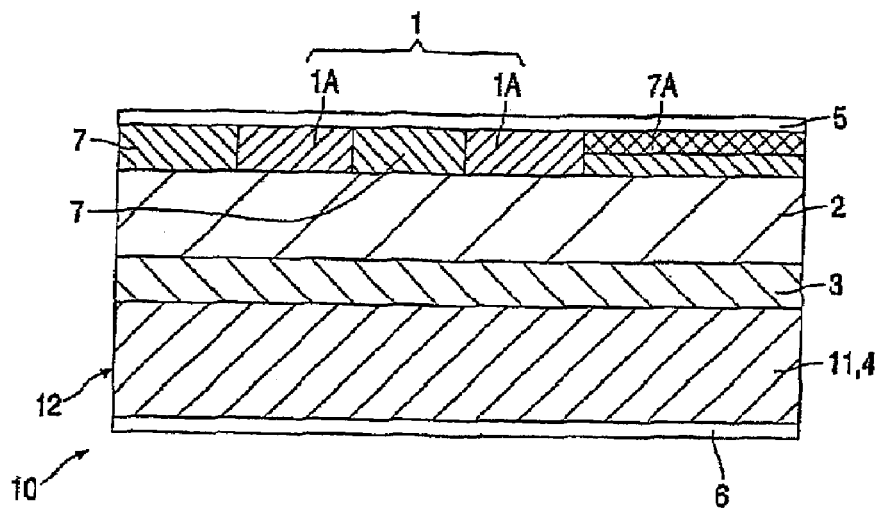
Figure 12:
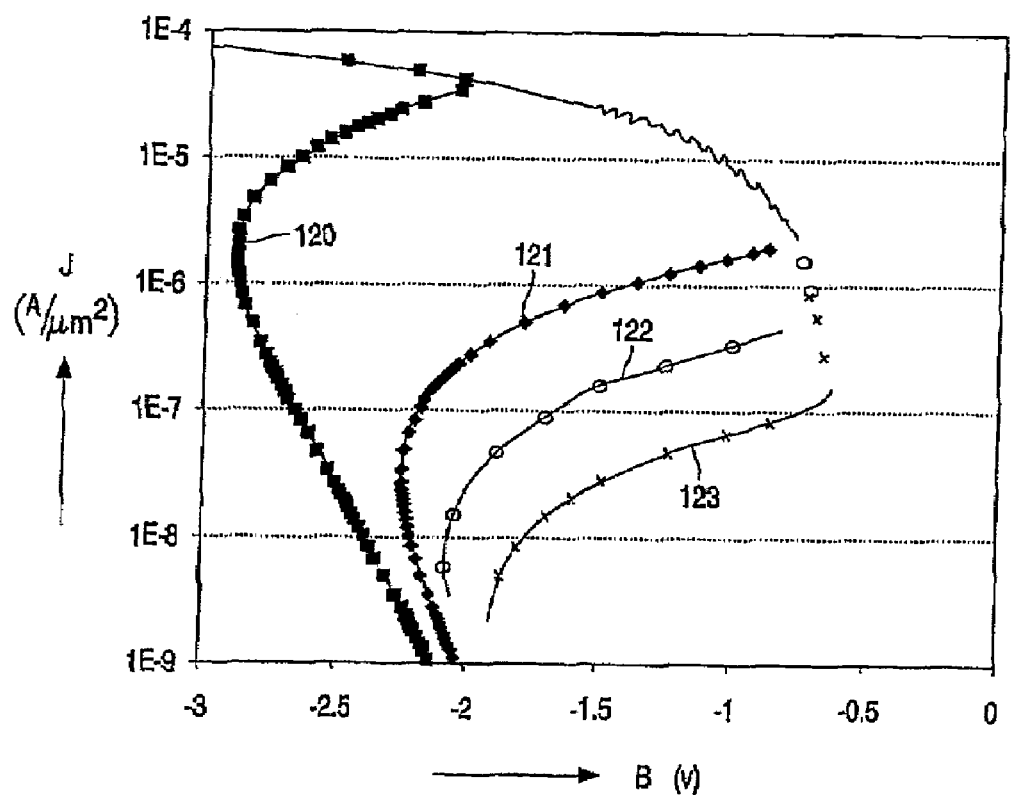

In the drawings:

FIG. 1 is a diagrammatic, cross-sectional view at right angles to the thickness direction, of a first example of a semiconductor device in accordance with the invention, FIG. 2 is a diagrammatic, cross-sectional view taken on the line II-II of the device shown in FIG. 1, FIG. 3 is a diagrammatic, cross-sectional view taken on the line III-III of the variation of the doping concentration in the device of FIG. 1, FIGS. 4 through 10 are diagrammatic, cross-sectional views at right angles to the thickness direction, of the device of FIG. 1 in successive stages of the manufacture by means of a method in accordance with the invention, FIG. 11 is a diagrammatic, cross-sectional view at right angles to the thickness direction, of a second example of a semiconductor device in accordance with the invention, and FIG. 12 shows the current density (J) as a function of the voltage (B) of the device of FIG. 11 for different values of the width of the widest part of the further semiconductor region.

The Figures are not drawn to scale and particularly the dimensions in the thickness direction are exaggerated for clarity. Corresponding regions are indicated by means of the same reference numerals whenever possible, and regions having the same conductivity type are generally indicated by means of the same hatching pattern.

FIG. 1 is a diagrammatic, cross-sectional view at right angles to the thickness direction, of a semiconductor device in accordance with the invention. Said device, a so-termed punchthrough diode, comprises a semiconductor body 12 with an n+ silicon semiconductor substrate 11 and a series of semiconductor regions 1, 2, 3, 4, being, respectively, an n++ region 1, an n− region 2, a p+ region 3 and an n++ region 4. The diode is provided with two connection conductors 5, 6. During operation of the diode an electric voltage is applied across it, and the thickness and the doping concentration of the second and the third semiconductor region 2, 3 are chosen such that they are depleted during operation.

In accordance with the invention, the first semiconductor region 1 comprises a number of sub-regions 1A which are separated from each other and surrounded by a p-type further semiconductor region 7. Said further semiconductor region 7 is connected to the first connection conductor 5 which is also connected, via another n++ semiconductor region 8 and via the substrate 11, to the first semiconductor region 1. FIG. 2 shows the sub-regions 1A of the first semiconductor region 1, which are surrounded by the further semiconductor region 7. In FIG. 2 seven sub-regions 1A are shown, but only three thereof are shown in FIG. 1 for the sake of simplicity. It has been found that such a device has a particularly steep I-V characteristic, also if the design voltage is above 2 volts, as a result of which the device may be used, and is very attractive even, as an alternative to Zener diodes for suppressing voltage peaks. The invention is based on the following recognition.

The punchthrough diode 10 may be regarded as a bipolar transistor with an open base 3, i.e. without a base connection. If a forward voltage is applied to the device, the junction between the p+ region 9 and the n− region 2 is slightly forward-poled. This means that the n++ region 4 then acts as an emitter of the transistor, the p+ region as the base and the n− region 2 and the n++ region 1 form the collector. If the collector-emitter breakdown voltage of the transistor (=BVCEO) is lower than the punchthrough voltage at any current intensity, the diode 10 will exhibit a negative resistance behavior. This may cause instability such as an undesirable oscillation. A relation between the BVCEO and the junction breakdown voltage (=BVCBO) is: $BVCEO = BVCBO/\beta^{1/n}$, wherein $\beta$ is the current gain that is equal to the quotient of the base current (ib) and the collector current (ic) and n has a value in the range between 3 and 4. The base current is determined by the recombination of holes and electrons in the lightly doped region 2, i.e. the n− region 2. In the known diode 10 the current gain may be very high because the recombination in said regions is very low due to the long recombination lifetime of charge carriers in (bulk) silicon. In addition, the lateral diffusion-capability of holes is limited because the base region 3 is depleted during operation. Thus, BVCEO is low. In a device 10 in accordance with the invention, on the one hand, the further semiconductor region 7, which in the example discussed is of the p conductivity type, offers an escape route for the holes generated by impact ionization. As this region 7 is, as it were, distributed over the first semiconductor region 1 this escape route is present everywhere and, at least in the lateral direction, the holes do not have to bridge a distance to reach this escape route and can readily flow from the base 1 to the emitter 4. As the holes can be readily drained, the occurrence of collector-emitter breakdown is precluded and hence also the occurrence of instability (oscillation) caused by negative resistance behavior. On the other hand, the first, n-type, semiconductor region 1 divided into parts 1A still provides excellent contact for the main constituent of the electric current through the device 10, i.e. the electron current. As a result, the I-V characteristic is very steep, which is highly desirable.

Doping concentrations found to be suitable for the first, second, third and fourth semiconductor region 1, 2, 3, 4 are at least, respectively, $10^{17}$ to $10^{20}$ at/cm$^3$, $10^{14}$ to $10^{17}$ at/cm$^3$, $10^{16}$ to $10^{18}$ at/cm$^3$ and $10^{17}$ to $10^{20}$ at/cm$^3$. In this example, said doping concentrations are, respectively, $5\times10^{18}$, $10^{15}$, $10^{17}$ and $10^{18}$ at/cm$^3$. This variation of the doping concentrations in the device 10 in accordance with the invention is diagrammatically shown in FIG. 3. The thicknesses of said regions 1, 2, 3, 4 are in this case 10 nm, 1 μm, 200 nm and 300 μm, respectively. More generally it can be said that the fourth region 4 comprises at least ten times the doping level of the third region 3, and the second region 2 comprises less than one tenth of the doping level of the third region 3. If, unlike this example, the second region 2 is a p− region, then it applies to the second and third region 2, 3 that the sum of the products of thickness and doping concentration is approximately $2\times10^{12}$ at/cm$^2$.

In this example, the semiconductor body 12 comprises a mesa-shaped part 12A which is approximately square and measures 200×200 μm$^2$, and which has a height of 2 μm and comprises at least the fourth, third and second semiconductor region 4, 3, 2 and, in this case, also a part of the first region 1, and the walls of which are covered with an isolating layer 111, in this case of silicon dioxide having a thickness of 300 nm, which is provided with apertures accommodating the connection conductors 5, 6. At the location of the junction between the p+ region 3 and the n− region 2 there is a p+ region 9 at the edge of the mesa 12A, which p+ region serves as a so-termed guard ring and prevents a premature punchthrough near the edge of the mesa 12A. The two connection conductors 5, 6 contain 10 nm AlSo, 100 nm TiW(N) and 0.5 μm Al. The lateral dimensions of the semiconductor device 12 are approximately 10 μm larger than the mesa-shaped part 12A thereof. In addition, in this example, the further semiconductor region 7 comprises, on the outside of the mesa 12A, a wider portion 7A which, in this case, is 20 μm wide, while the other parts of the further semiconductor region 7 which are situated between the sub-regions 1A have a width of 2 μm, just like the sub-regions 1A of the first semiconductor region 1.

FIGS. 4 through 10 are diagrammatic cross-sectional views at right angles to the thickness direction, of the device of FIG. 1 in successive stages of the manufacture by means of a method in accordance with the invention. An n-type Si substrate 11 (see FIG. 4) is used as the starting material. An epitaxial layer 14 of lightly doped silicon is deposited on the substrate 11, in this case by means of non-selective gas-phase epitaxy at a temperature of 700° C. Next (see FIG. 5) a p-type ion implantation is carried out, causing the entire epitaxial layer 14 to become p+ type and the further semiconductor region 7 to be formed. Subsequently, the semiconductor body 12 is provided with a mask, not shown in the drawing, and the sub-regions 1A of the first semiconductor region 1 as well as the other semiconductor region 8 are formed by means of an n+ ion implantation that reaches at least as far as the junction between the further semiconductor region 7 and the substrate 11.

Next (see FIG. 6) a stack of layers 2, 3, 4 is epitaxially provided from which the second, third and fourth semiconductor region 2, 3, 4 will be formed. Next (see FIG. 7) a mask 70 is provided that serves as an etch mask during an etching process wherein a mesa 71 is formed that comprises the fourth semiconductor region 4 and a (large) part of the third semiconductor region 3. Subsequently (see FIG. 8) a p+ ion implantation is carried out, thereby forming the guard ring 9. Next, so-termed spacers 80 are formed against the walls of the mesa 71 in a customary manner.

The etching operation of the semiconductor body 12 is now continued (see FIG. 9), thereby forming the mesa-shaped part 12A thereof, and said operation reaching into the further semiconductor region 7. Next, a mask is used, which is not shown in the Figure, to form the other n+ semiconductor region 8 by means of ion implantation. Subsequently (see FIG. 10), after removal of the spacers 80, the semiconductor body 12, 12A is covered with an isolating layer 111 which is provided with apertures, as shown in the Figure, and at the location of said apertures the connection conductors 5, 6 are formed from a deposited and patterned conductor layer. At this stage, the device 10 in accordance with the invention is ready for final assembly. If a large number of semiconductor devices 10 in accordance with the invention are simultaneously formed in a single semiconductor body 12, individual devices 10 can be obtained by applying a separation process such as sawing.

FIG. 11 is a diagrammatic cross-sectional view at right angles to the thickness direction, of a second example of a semiconductor device in accordance with the invention. The most essential difference between the device 10 of this example and that of the first example is that the first, second, third and fourth semiconductor region 1, 2, 3, 4 are situated in a reversed order with respect to the substrate 11. In addition, the fourth semiconductor region 4 is formed, in this case, by the substrate 11 itself, which is not essential however. The sub-regions 1A of the first semiconductor region 1 and the further semiconductor region 7 border directly on the first connection conductor 5 which is situated, in this case, on top of the semiconductor body 12. The device 10 of this example has various advantages, such as the possibility of accurately forming and defining the further semiconductor region 7, which in this case is situated close to the service of the semiconductor body 12, by means of ion implantation. Also the manufacture of the device 10 is comparatively simple because all semiconductor regions 1, 2, 3, 4 can be provided in a single epitaxial growth process. The device 10 of this example can of course be provided with a guard ring like in the first example. The manufacture can be readily adapted thereto.

FIG. 12 shows the current density (J) as a function of the voltage (B) of the device of FIG. 11 for different values of the width of the widest part 7A of the further semiconductor region 7. Curves 120, 121, 122 and 123 correspond to a width of said part 7A of 1, 5, 10 and 20 μm, respectively. These results clearly show that a particularly useful I-V characteristic is found at a width in excess of approximately 5 μm.

The invention is not limited to the exemplary embodiment described above, and, within the scope of the invention, many modifications and variations are possible to those skilled in the art. For example other thicknesses, other (semiconductor) materials or other compositions than those mentioned in the example can be applied. Also, all conductivity types used can be simultaneously replaced by the opposite. Various process steps which are not relevant for the invention can also be carried out in a different manner, for example an oxide layer obtained by plasma deposition may also be formed by deposition from the gas phase.

It is finally noted that the application of the device and the method in accordance with the invention is not limited to discrete devices. Other (semiconductor) components can be integrated into the semiconductor body.

What is claimed is:

1. A semiconductor device comprising:
   a substrate of a first conductivity type;
   a first semiconductor region that includes a plurality of sub-regions of the first conductivity type that have a first doping concentration and a further semiconductor region of a second conductivity type opposite to the first conductivity type, the further semiconductor region separating the sub-regions from each other, the first semiconductor region located on the substrate;
   a second semiconductor region of the first conductivity type and having a second doping concentration which is lower than the first doping concentration, the second semiconductor region located on the first semiconductor region;
   a third semiconductor region of the second conductivity type and having a third doping concentration ranging between the first and the second doping concentration, the third semiconductor region located on the second semiconductor region; and
   a fourth semiconductor region of the first conductivity type and having a fourth doping concentration which is higher than the first doping concentration, the fourth semiconductor region located on the third semiconductor region,
   wherein the sub-regions extend from the second semiconductor region into the substrate, and wherein the thickness and the doping concentration of the second and the third semiconductor region are such that these regions are completely depleted during operation of the device.

2. A semiconductor device as claimed in claim 1, further comprising:
   a first electric connection conductor that is located on a side of the semiconductor device and that is electrically connected to the further semiconductor region; and
   a second electric connection conductor that is located on and electrically connected to the fourth semiconductor region,
   wherein an electric voltage is applied across the first and second connection conductors during operation of the device.

3. A semiconductor device as claimed in claim 2, further comprising another semiconductor region of the first conductivity type having a higher doping concentration than the substrate, the another semiconductor region being connected to the substrate, to the first electric connection conductor, and to the further semiconductor region.

4. A semiconductor device as claimed in claim 1, wherein the further semiconductor region surrounds each of the sub-regions.

5. A semiconductor device as claimed in claim 1, wherein the sub-regions of the first semiconductor region have a width in the range between 1 and 5 μm.

6. A semiconductor device as claimed in claim 1, wherein the first conductivity type is n-type.

7. A semiconductor device comprising:
a substrate of a first conductivity type;
a first semiconductor region that includes a plurality of sub-regions of the first conductivity type that have a first doping concentration and a further semiconductor region of a second conductivity type opposite to the first conductivity type, the further semiconductor region separating the sub-regions from each other, the first semiconductor region located on the substrate;
a second semiconductor region of the first conductivity type and having a second doping concentration which is lower than the first doping concentration, the second semiconductor region located on the first semiconductor region;
a third semiconductor region of the second conductivity type and having a third doping concentration ranging between the first and the second doping concentration, the third semiconductor region located on the second semiconductor region; and
a fourth semiconductor region of the first conductivity type and having a fourth doping concentration which is higher than the first doping concentration, the fourth semiconductor region located on the third semiconductor region,
wherein the sub-regions extend from the second semiconductor region into the substrate, and wherein the thickness and the doping concentration of the second and the third semiconductor region are such that these regions are completely depleted during operation of the device, and
wherein a part of the further semiconductor region that borders on one of the sub-regions of the first semiconductor region has a larger width than the other parts of the further semiconductor region.

8. A semiconductor device as claimed in claim 7, wherein the wider part is situated on an outer side of the further sub-region.

9. A semiconductor device as claimed in claim 7, wherein the wider part has a width in the range between 5 and 20 μm, and the other parts of the further semiconductor region have a width in the range of 1 to 5 μm.

10. A method of manufacturing a semiconductor device having a substrate of a first conductivity type, the method comprising:
forming a first semiconductor region on the substrate, the first semiconductor region including a plurality of sub-regions of the first conductivity type that have a first doping concentration and a further semiconductor region of a second conductivity type that is opposite to the first conductivity type, the further semiconductor region separating each of the sub-regions from each other;
forming a second semiconductor region of the first conductivity type on the first semiconductor region, the second semiconductor region having a second doping concentration that is lower than the first doping concentration;
forming a third semiconductor region of the second conductivity type on the second semiconductor region, the third semiconductor region having a third doping concentration ranging between the first and the second doping concentration; and
forming a fourth semiconductor region of the first conductivity type on the third semiconductor region, the fourth semiconductor region having a fourth doping concentration that is higher than the first doping concentration,
wherein the sub-regions extend from the second semiconductor region into the substrate, and wherein the thickness and the doping concentration of the second semiconductor region are chosen such that, during operation, the second semiconductor region is completely depleted.

11. A method as claimed in claim 10, further comprising:
forming a first electric connection conductor that is electrically connected to the further semiconductor region; and
forming a second electric connection conductor on the fourth semiconductor region, the second electric connection conductor being electrically connected to the fourth semiconductor region,
wherein an electric voltage is applied across the first and second electric connection conductors during operation of the device.

12. A method as claimed in claim 11, further comprising forming another semiconductor region of the first conductivity type on the substrate, the another semiconductor region having a higher doping concentration than the substrate, wherein the another semiconductor region is connected to the substrate, to the first electric connection conductor, and to the further semiconductor region.

13. A method as claimed in claim 11, wherein the third, second and first semiconductor regions are successively provided on the substrate with epitaxy, thereafter the further semiconductor region is formed in the first semiconductor region with ion implantation, and then the electric connection conductors are provided.

14. A method as claimed in claim 10, wherein the further semiconductor region surrounds each of the sub-regions and the first conductivity type is n-type.

15. A method as claimed in claim 10, wherein the first semiconductor region is formed on the substrate by applying a lightly doped epitaxial semiconductor layer that is provided with the second conductivity type by means of an ion implantation that reaches at least as far as the substrate, as a result of which the further semiconductor region is formed, and wherein the sub-regions of the first semiconductor region are formed by a further ion implantation that reaches at least up to the substrate, after which the second, third and fourth semiconductor regions are formed by epitaxy.

16. A method of manufacturing a semiconductor device having a substrate of a first conductivity type, the method comprising:
forming a first semiconductor region on the substrate, the first semiconductor region including a plurality of sub-regions of the first conductivity type that have a first doping concentration and a further semiconductor region of a second conductivity type that is opposite to the first conductivity type, the further semiconductor region separating each of the sub-regions from each other;
forming a second semiconductor region of the first conductivity type on the first semiconductor region, the second semiconductor region having a second doping concentration that is lower than the first doping concentration;

forming a third semiconductor region of the second conductivity type on the second semiconductor region, the third semiconductor region having a third doping concentration ranging between the first and the second doping concentration; and forming a fourth semiconductor region of the first conductivity type on the third semiconductor region, the fourth semiconductor region having a fourth doping concentration that is higher than the first doping concentration, wherein the sub-regions extend from the second semiconductor region into the substrate, and wherein the thickness and the doping concentration of the second semiconductor region are chosen such that, during operation, the second semiconductor region is completely depleted, and wherein a part of the further semiconductor region which borders on one of the sub-regions of the first semiconductor region is provided with a larger width than the other parts of the further semiconductor region.

\* \* \* \* \*